(12) United States Patent
Iwashita et al.

(10) Patent No.: US 9,005,851 B2
(45) Date of Patent: Apr. 14, 2015

(54) PHASE SHIFT MASK BLANK AND PHASE SHIFT MASK

(71) Applicant: Hoya Corporation, Tokyo (JP)

(72) Inventors: Hiroyuki Iwashita, Tokyo (JP); Hiroaki Shishido, Tokyo (JP); Atsushi Kominato, Tokyo (JP); Masahiro Hashimoto, Tokyo (JP)

(73) Assignee: Hoya Corporation, Tokyo (JP)

( * ) Notice: Subject to any disclaimer, the term of this patent is extended or adjusted under 35 U.S.C. 154(b) by 0 days.

(21) Appl. No.: 13/670,728

(22) Filed: Nov. 7, 2012

(65) Prior Publication Data

US 2013/0065166 A1    Mar. 14, 2013

Related U.S. Application Data

(62) Division of application No. 13/001,365, filed as application No. PCT/JP2009/061574 on Jun. 25, 2009, now Pat. No. 8,329,364.

(60) Provisional application No. 61/075,558, filed on Jun. 25, 2008.

(51) Int. Cl.
   *G03F 1/26* (2012.01)
   *G03F 1/58* (2012.01)

(52) U.S. Cl.
   CPC ... *G03F 1/26* (2013.01); *G03F 1/58* (2013.01)
   USPC ............................................................. 430/5

(58) Field of Classification Search
   USPC ................ 430/5, 30, 322, 323; 428/428, 430
   See application file for complete search history.

(56) References Cited

U.S. PATENT DOCUMENTS

| | | | |
|---|---|---|---|
| 5,942,356 A | 8/1999 | Mitsui et al. | |
| 8,329,364 B2 * | 12/2012 | Iwashita et al. | 430/5 |
| 2005/0190450 A1 | 9/2005 | Becker et al. | |
| 2007/0020534 A1 | 1/2007 | Yoshikawa et al. | |
| 2008/0107972 A1 | 5/2008 | Yamayoshi | |
| 2009/0155698 A1 | 6/2009 | Yamada et al. | |

FOREIGN PATENT DOCUMENTS

| | | |
|---|---|---|
| EP | 1584979 A1 | 10/2005 |
| JP | 3411613 B2 | 10/1994 |
| JP | 2837803 B2 | 12/1994 |
| JP | 3445329 B2 | 5/1995 |
| JP | 2966369 B2 | 6/1998 |
| JP | 2005-208660 A | 8/2005 |
| JP | 2007-033470 A | 2/2007 |
| JP | 2008-065138 A | 3/2008 |
| JP | 2008-116691 A | 5/2008 |
| TW | 200731005 A | 8/2007 |
| WO | 2004/090635 A1 | 10/2004 |

* cited by examiner

*Primary Examiner* — Stephen Rosasco
(74) *Attorney, Agent, or Firm* — Sughrue Mion, PLLC

(57) ABSTRACT

The present invention provides a photomask blank used for producing a photomask to which an ArF excimer laser light is applied, wherein: a light-shielding film is provided on a light transmissive substrate; the light-shielding film has a laminated structure in which a lower layer, an interlayer and an upper layer are laminated in this order from the side close to the light transmissive substrate; the thickness of the entire light-shielding film is 60 nm or less; the lower layer is made of a film containing a metal and has a first etching rate; the upper layer is made of a film containing a metal and has a third etching rate; the interlayer is made of a film containing the same metal as that contained in the lower layer or the upper layer and has a second etching rate that is lower than the first etching rate and the third etching rate; and the thickness of the interlayer is 30% or less of the thickness of the entire light-shielding film.

15 Claims, 1 Drawing Sheet

PHASE SHIFT MASK BLANK AND PHASE SHIFT MASK

CROSS REFERENCE TO RELATED APPLICATIONS

This is a Divisional of application Ser. No. 13/001,365 filed Dec. 23, 2010, claiming priority based on International Application No. PCT/JP2009/061574 filed Jun. 25, 2009, which claims priority from U.S. Provisional Patent Application No. 61/075,558 filed Jun. 25, 2008, the contents of all of which are incorporated herein by reference in their entirety.

TECHNICAL FIELD

The present invention relates to a phase shift mask blank and a phase shift mask.

BACKGROUND ART

In general, in the production processes of high-density semiconductor integrated circuits such as LSI, color filters for CCD (charge-coupled device) and LCD (liquid crystal display device), magnetic heads, etc., microfabrication utilizing the photolithographic technique using photomasks is performed.

In this microfabrication, a photomask, in which a light-shielding film consisting of a metal thin film such as a chromium film is generally formed on a light transmissive substrate made of quartz glass, aluminosilicate glass or the like by means of sputtering, vacuum deposition or the like to provide a photomask blank, wherein the light-shielding film is formed to have a predetermined pattern, is used.

A photomask is produced using such a photomask blank with the following processes: an exposure process in which a desired pattern exposure is applied to a resist film formed on the photomask blank; a development process in which, after the desired pattern exposure is applied to the resist film formed on the photomask blank, a developing solution is supplied thereto to dissolve portions of the resist film soluble in the developing solution, thereby forming a resist pattern; a etching process in which, using the obtained resist pattern as a mask, portions in which a light-shielding film is exposed with the resist pattern not formed are removed by etching, such as, wet etching using an etching solution consisting of a mixed aqueous solution of ceric ammonium nitrate and perchloric acid, and dry etching using chlorine gas, thereby forming a predetermined mask pattern on a light transmissive substrate; and a stripping/removing process in which the remaining resist pattern is stripped and removed.

During patterning of the light-shielding film in the etching process, the resist pattern formed on the light-shielding film must remain with a sufficient film thickness. However, when the resist film thickness is increased, the aspect ratio is increased, and this causes the problem of pattern collapsing, etc., particularly in the case where a fine pattern is to be formed. Therefore, in order to miniaturize a mask pattern formed on a photomask, it is required to decrease the thickness of a resist film formed on a photomask blank.

Regarding this point, Japanese Laid-Open Patent Publication No. 2007-33470 (Patent Document 1) discloses a photomask blank comprising a light-shielding film having a thickness of 100 nm or less, wherein the film has a structure in which the percentage of the film thickness of a chromium-based compound having a high etching rate is 70% or more to enable reduction in etching time, thereby realizing miniaturization of the resist. Specifically, Patent Document 1 discloses a photomask blank in which a semitransparent film, a CrON film, a Cr film and a CrON film are laminated on a light transmissive substrate, wherein the percentage of the thickness of the CrON film is 70% or more.

However, regarding the above-described CrON film, it is just that the optical density per unit film thickness at a wavelength of 450 nm is set, and regarding a wavelength of exposure light equal to or less than wave length of an ArF excimer laser light, no optimization has been made. In particular, in the case of hyper-NA lithography, the angle of light incidence relative to a photomask becomes shallower, and this causes the problem that a miniaturized mask pattern itself shades a transfer image (shadowing). When a light-shielding film is thick, reduction of the amount of light (deterioration of contrast) due to shadowing is highly influential. In addition, the cross-section shape is prone to vary, and this, together with shadowing, causes reduction of transfer accuracy of CD (Critical Dimension).

Further, in order to improve resolution performance by finer processing of a photomask, a phase shift mask blank, in which, for example, a phase shift film having the transmittance of several percent to several tens percent with the phase of transmitted light being shifted 180° (e.g., a phase shift film made of a metal silicide oxide film or a metal silicide oxide nitride film described in the specification of Japanese Patent No. 2837803 (Patent Document 2), a metal silicide nitride film described in the specification of Japanese Patent No. 2966369 (Patent Document 3) or the like) and a light-shielding film such as a chromium film having etching selectivity relative to the phase shift film are formed on the above-described light transmissive substrate by means of sputtering, vacuum deposition or the like, and a phase shift mask in which these light-shielding film and phase shift film are formed in a predetermined pattern are used.

Regarding the structure of the phase shift mask, a general example in the case where the transmittance of the phase shift film is 10% or more (e.g., 10% to 40%) is described in the specification of Japanese Patent No. 3445329 (Patent Document 4; Example 1 and FIG. 1), and this is a phase shift mask having a structure in which a light-shielding film pattern is formed on a phase shift film pattern formed within a pattern transfer region and a light-shielding film with a width of a predetermined value or more is formed in a non-pattern-transfer region. Further, a general example in the case where the transmittance of the phase shift film is less than 10% (e.g., 2 to less than 10%) is described in the specification of Japanese Patent No. 3411613 (Patent Document 5; Example 1 and FIG. 1), and this is a phase shift mask having a structure in which no light-shielding film pattern is formed on a phase shift film pattern formed within a pattern transfer region and a light-shielding film with a width of a predetermined value or more is formed in a non-pattern-transfer region.

As recited in claims 25 to 29 in International Publication WO 2004/090635 pamphlet (Patent Document 6), a phase shift mask blank may have a structure in which a film for etching mask made of an inorganic material having resistance to dry etching of a light-shielding film is laminated on the light-shielding film, which is formed on a phase shift film and comprises chromium.

[Patent Document 1] Japanese Laid-Open Patent Publication No. 2007-33470
[Patent Document 2] Japanese Patent No. 2837803
[Patent Document 3] Japanese Patent No. 2966369
[Patent Document 4] Japanese Patent No. 3445329
[Patent Document 5] Japanese Patent No. 3411613
[Patent Document 6] International Publication WO 2004/090635 pamphlet

DISCLOSURE OF THE INVENTION

Problems to be Solved by the Invention

Under the above-described circumstances, a photomask blank by which a fine mask pattern can be formed (e.g., a phase shift blank) is desired. In addition, a photomask blank, by which a thin resist film can be formed on a light-shielding film, wherein pattern collapsing does not easily occur and good transfer accuracy is provided as a result, is desired. Specifically, it is desired to provide a photomask having a resolution desired for a generation of hp 45 nm, hp 32 nm or beyond by reducing the thickness of the resist film and the aspect ratio of the resist pattern in order to prevent collapsing of the resist pattern.

In order to reduce the thickness of a resist film in a photomask blank, it is required to shorten the etching time (ET) of the light-shielding film, that is, to change the structure of the light-shielding film.

The etching time (ET) is determined by the etching rate (ER), the thickness of the light-shielding film (d) and the cross-section angle adjustment time (over etching time) (OET) of the light-shielding film pattern. The relationship between them is as follows:

$$ET = d/ER + OET \qquad (1)$$
$$= CET + OET$$

In formula (1), "CET" means clear etching (just etching) time, and is time required for etching of a monitor pattern (generally a several-mm-square hole pattern) to reach a substrate or a lower-layer film such as a phase shift film.

Accordingly, it is desired to provide a photomask blank having a light-shielding film with short etching time (ET) by promoting improvement of the etching rate (ER), reduction in the thickness (d) of the light-shielding film, reduction in over etching time (OET), etc.

In order to reduce over etching time (OET), it is required to reduce variation of the cross-section shape due to loading. However, when the etching rate (ER) is too high, an under-cut occurs during over etching, whereas when the etching rate (ER) is too low, etching time (ET) becomes longer. Therefore, it is desired to provide a photomask blank in which the etching rate in the longitudinal direction (etching rate of each layer) is controlled to enable reduction in over etching time (OET) as a result.

In order to increase the etching rate (ER), it is usually required to decrease the content of metals. However, when the content of metals is kept at a low level, the optical density per unit film thickness becomes lower, and as a result, the film thickness required for the light-shielding film to obtain a predetermined optical density is increased. Therefore, it is desired to provide a photomask blank, wherein a high etching rate (ER) is provided, and wherein a light-shielding film has a relatively low film thickness by which a sufficient optical density is provided.

Moreover, it is desired to provide a photomask blank, wherein, for example, by preventing unintended etching (e.g., an under-cut), etc., the cross section of the light-shielding film formed after etching is perpendicular to a substrate regardless of the pattern density, and wherein the cross section of the light-shielding film after etching is smooth.

With respect to the characteristics of the light-shielding film desired in the above-described photomask blank, the same characteristics are desired regarding a light-shielding film on a phase shift film formed in a halftone phase shift mask blank.

Furthermore, it is desired to provide a light-shielding film which is optimized for a phase shift mask and a blank thereof, wherein the thickness of a phase shift film is reduced, collapsing of OPC (Optical Proximity Correction) pattern does not occur, requirements for pattern accuracy can be satisfied, and control of optical properties and pattern defect test can be carried out.

Means for Solving the Problems

The present inventor found a phase shift mask blank which enables formation of a fine mask pattern, wherein a light-shielding film consists of three or more layers and the etching rate of each of the layers satisfies predetermined conditions. The present invention provides a phase shift mask blank and a phase shift mask as described below.

[1] A phase shift mask blank, which is an original plate of a phase shift mask exposed to an ArF excimer laser light, wherein:
the phase shift mask blank has a light transmissive substrate, a phase shift film and a light-shielding film;
the phase shift film is provided between the light transmissive substrate and the light-shielding film;
the phase shift amount of the phase shift film with respect to the ArF excimer laser light is 160° to 200° and the transmittance of the phase shift film is 2 to 40%;
the light-shielding film has a laminated structure in which a lower layer, an interlayer and un upper layer are laminated in this order from the side close to the light transmissive substrate;
the thickness of the entire light-shielding film is 60 nm or less;
the lower layer is made of a film containing a metal and has a first etching rate;
the upper layer is made of a film containing a metal and has a third etching rate; and
the interlayer is made of a metallic nitride film, which contains the same metal as that contained in the lower layer or the upper layer and nitrogen, and has a second etching rate that is lower than the first etching rate and the third etching rate.

[2] The phase shift mask blank according to item [1], wherein:
the phase shift amount of the phase shift film is less than 180° and the transmittance of the phase shift film is 10% or more; and
the thickness of the entire light-shielding film is 50 nm to 60 nm.

[3] The phase shift mask blank according to item [1] or [2], wherein the phase shift film is made of a material comprising: at least one substance selected from the group consisting of oxygen and nitrogen; a metal; and silicon as the main components.

[4] The phase shift mask blank according to any one of items [1] to [3], wherein the thickness of the interlayer is 30% or less of the thickness of the entire light-shielding film.

[5] The phase shift mask blank according to any one of items [1] to [4], wherein the thickness of the interlayer is 40% or less of the thickness of the lower layer.

[6] The phase shift mask blank according to any one of items [1] to [5], wherein the thickness ratio of the interlayer to the upper layer is 1.0:0.7 to 1.0:7.0.

[7] The phase shift mask blank according to any one of items [1] to [6], wherein: the optical density per unit film thickness of the upper layer or the lower layer is 0.04 nm$^{-1}$ or less; and the optical density per unit film thickness of the interlayer is 0.05 nm$^{-1}$ or more.

[8] The phase shift mask blank according to any one of items [1] to [7], wherein:
the optical density of the lower layer is 1.1 to 1.8;
the optical density of the interlayer is 0.1 to 0.35; and
the optical density of the upper layer is 0.4 to 0.6.

[9] The phase shift mask blank according to any one of items [1] to [8], wherein:
the sum of the content of N and the content of O in the lower layer is 40 to 55 atomic %;
the sum of the content of N and the content of O in the interlayer is 30 atomic % or less; and
the sum of the content of N and the content of O in the upper layer is 45 to 65 atomic %.

[10] The phase shift mask blank according to any one of items [1] to [9], wherein: the optical density per unit film thickness of the lower layer is 0.03 to 0.04 nm$^{-1}$; and the optical density per unit film thickness of the interlayer is 0.05 to 0.06 nm$^{-1}$.

[11] The phase shift mask blank according to any one of items [1] to [10], wherein:
in the lower layer, the metal content is 25 to 50 atomic %, the sum of the content of N and the content of O is 35 to 65 atomic %, and the optical density is 1.1 to 1.8;
the interlayer comprises the metal and N, wherein the metal content is 50 to 90 atomic %, the thickness is 2 to 7 nm, and the optical density is 0.1 to 0.35; and
in the upper layer, the metal content is 25 to 50 atomic %, the sum of the content of N and the content of O is 45 to 65 atomic %, and the optical density is 0.4 to 0.6.

[12] The phase shift mask blank according to any one of items [1] to [11], wherein:
in the lower layer, the content of Cr is 30 to 40 atomic %, the sum of the content of N and the content of O is 40 to 55 atomic %, and the optical density is 1.1 to 1.8;
in the interlayer, the content of Cr is 50 to 90 atomic %, the content of N is 3 to 25 atomic %, and the optical density is 0.1 to 0.35; and
in the upper layer, the content of Cr is 30 to 40 atomic %, the sum of the content of N and the content of O is 50 to 60 atomic %, and the optical density is 0.4 to 0.6.

[13] The phase shift mask blank according to any one of items [1] to [12], wherein the etching rates of the lower layer, the interlayer and the upper layer have the following relationship:

Second etching rate<First etching rate≤Third etching rate.

[14] A phase shift mask, which is produced using the phase shift mask blank according to any one of items [1] to [13].

Advantageous Effect of the Invention

It is possible to reduce the thickness of a light-shielding film of a phase shift mask blank in a preferred embodiment of the present invention, and this enables reduction in clear etching time (CET), and in addition, over etching time (OET) is also reduced. In particular, in a photomask blank in a preferred embodiment of the present invention, it is possible to reduce the thickness of a light-shielding film having a structure made of a plurality of layers (particularly a three-layer structure) by providing a light-shielding layer (absorption layer) having a high content of a metal such as Cr, and this enables reduction in clear etching time (CET) and over etching time (OET).

Moreover, in a phase shift mask blank in a preferred embodiment of the present invention, over etching time (OET) can be reduced by combining a film containing a metal (e.g., Cr) having a high etching rate (ER) (antireflection layer) with a metal-containing film having a low etching rate (ER) (absorption layer), by providing a predetermined balance between the thickness of the layer having the high etching rate (ER) and the thickness of the layer having the low etching rate (ER), and by disposing the layer having the low etching rate (ER) at a predetermined position.

In a phase shift mask blank in a preferred embodiment of the present invention, the thickness of a resist formed on a light-shielding film can be reduced by reducing clear etching time (CET), over etching time (OET) or both of them. As a result, in the phase shift mask blank in the preferred embodiment of the present invention, the problem of pattern collapsing, etc. is not easily caused, and therefore, a fine mask pattern can be formed thereby.

Moreover, in a preferred embodiment of the present invention, by providing a structure in which a plurality of layers having a different metal content with a predetermined thickness are laminated, it is possible to provide a phase shift mask blank comprising a light-shielding film having a predetermined thickness by which a sufficient optical density can be provided, wherein the etching rate (ER) of the entire light-shielding film is high.

EXPLANATIONS OF LETTERS OR NUMERALS

Figure 1:
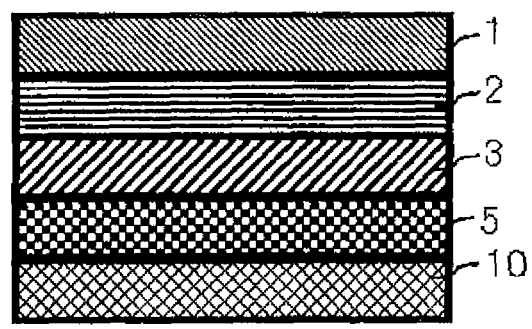
FIG. 1 shows a diagram of a phase shift mask blank produced in Examples 1 to 4.

1 . . . upper layer
2 . . . interlayer
3 . . . lower layer
5 . . . phase shift film
10 . . . light transmissive substrate

BEST MODE FOR CARRYING OUT THE INVENTION

In this specification, the "photomask blank" includes a so-called "binary photomask blank", a "phase shift mask blank" that has a phase shift film and a light-shielding film, etc. Note that the phase shift mask blank may be used as the phase shift mask so that phase shift effects are exerted, or used as the binary photomask blank (for example, a case where the light-shielding film and the phase shift film are etched to have the same pattern to allow the phase shift film to function as the light-shielding film) so that phase shift effects are not exerted.

In addition, the photomask blank of the present invention includes a photomask blank in which a resist film is formed and a photomask blank in which no resist film is formed. Accordingly, the phase shift mask blank of the present invention includes a phase shift mask blank in which a resist film is formed and a phase shift mask blank in which no resist film is formed.

1. First Embodiment

At the time of processing a light-shielding film formed on a phase shift film, the present inventor found the following matters:

(1) in the case of a two-layer structure made of a light-shielding layer and a front-surface antireflection layer, when the light-shielding layer that is a lower layer is formed with a material having a low etching rate, longer over etching time is required, and as a result, the total etching time is increased, whereas when the lower layer is formed with a material having a high etching rate, clear etching time is reduced, but there is a case where over etching time is increased due to loading, and thus, it is difficult to reduce etching time when using the two-layer structure; and (2) in order to reduce over etching time, it is preferred to employ a three-layer structure consisting of a lower layer, an interlayer and an upper layer, wherein a material having an etching rate higher than that of the interlayer is used for the upper layer and the lower layer. Thus, the invention of the phase shift mask blank of the first embodiment was achieved.

The phase shift mask blank of the first embodiment is as follows:

the phase shift mask blank of the present invention, which is an original plate of a phase shift mask exposed to an ArF excimer laser light, wherein:

the phase shift mask blank has a light transmissive substrate, a phase shift film and a light-shielding film;

the phase shift film is provided between the light transmissive substrate and the light-shielding film;

the phase shift amount of the phase shift film with respect to the ArF excimer laser light is 160° to 200° and the transmittance of the phase shift film is 2 to 40%;

the light-shielding film has a laminated structure in which a lower layer, an interlayer and un upper layer are laminated in this order from the side close to the light transmissive substrate;

the thickness of the entire light-shielding film is 60 nm or less;

the lower layer is made of a film containing a metal and has a first etching rate;

the upper layer is made of a film containing a metal and has a third etching rate; and the interlayer is made of a metallic nitride film, which contains the same metal as that contained in the lower layer or the upper layer and nitrogen, and has a second etching rate that is lower than the first etching rate and the third etching rate.

1.1. Light Transmissive Substrate

The light transmissive substrate is not particularly limited as long as it is a substrate that is light-transmissive. Examples thereof include a quartz glass substrate, an aluminosilicate glass substrate, a calcium fluoride substrate, and a magnesium fluoride substrate. Among them, the quartz glass substrate is preferred, because it has a high flatness level and a high smoothness level, and because, when transferring a pattern to a semiconductor substrate using a photomask, distortion of a transfer pattern does not easily occur and it is possible to perform pattern transfer with high accuracy.

1.2. Light-Shielding Film

Regarding the phase shift mask blank of the present invention, the light-shielding film in the phase shift mask blank of the first embodiment has a laminated structure in which a lower layer, an interlayer and an upper layer are laminated in this order from the side close to the light transmissive substrate. It is sufficient when the light-shielding film has at least 3 layers, i.e., the lower layer, the interlayer and the upper layer. Further, the light-shielding film may have another layer or other layers.

1.2.1. Constitution of Respective Layers

Among layers forming the light-shielding film, the lower layer is a layer provided to the downside of the interlayer (the side close to the light transmissive substrate). The lower layer preferably has a constitution in which the light shielding property and the etching property of the light-shielding film are controlled and in addition, the antireflection function and adhesion to a phase shift film, etc. are controlled.

When the lower layer has the antireflection function, it is sufficient when the back-surface reflectance of the lower layer is suppressed to a degree in which there is no influence on transfer properties by reflecting an exposure light incident from the light transmissive substrate opposite to the side on which the light-shielding film is formed by the lower layer to the side of an exposure light source. The back-surface reflectance with respect to a wavelength of an ArF excimer laser light is 40% or less, preferably 30% or less, and more preferably 20% or less.

Among the layers forming the light-shielding film, the interlayer is a layer provided between the lower layer and the upper layer. The interlayer controls the light shielding property and the etching property of the light-shielding film. Further, the interlayer preferably has the highest light-shielding effect among the layers in the film.

Among the layers forming the light-shielding film, the upper layer is a layer provided to the upside of the interlayer (the side far from the light transmissive substrate). The upper layer controls the light shielding property and the etching property of the light-shielding film, and in addition, it preferably has a constitution in which it controls chemical resistance with respect to washing of a phase shift mask blank or phase shift mask. Moreover, when using as a phase shift mask, the upper layer preferably exerts the effect to prevent reduction of the pattern accuracy caused because reflected light from a transferred product such as a semiconductor substrate returns to the transferred product. It is desired that the surface reflectance with respect to a wavelength of an ArF excimer laser light is 30% or less, preferably 25% or less, and more preferably 20% or less.

Regarding the light-shielding film of the phase shift mask blank of the first embodiment, it may be impossible to obtain a sufficient optical density from the entire light-shielding film or the film thickness may increase in the following cases: in the lower layer, the metal content is less than 25 atomic %, or the sum of the content of N and the content of O is more than 65 atomic %; in the interlayer, the metal content is less than 50 atomic %; or in the upper layer, the metal content is less than 25 atomic %, or the sum of the content of N and the content of O is more than 65 atomic %. Meanwhile, etching time of the light-shielding film may increase in the following cases: in the lower layer, the metal content is more than 50 atomic %, or the sum of the content of N and the content of O is less than 35 atomic %; in the interlayer, the metal content is more than 90 atomic %; or in the upper layer, the metal content is more than 50 atomic %, or the sum of the content of N and the content of O is less than 45 atomic %.

Further, in the upper layer, if the metal content is more than 50 atomic % or the sum of the content of N and the content of O is less than 45 atomic %, the surface reflectance becomes too high. In this case, it may be impossible to obtain the surface reflectance of about 20% or less which is required with respect to an ArF excimer laser light. Meanwhile, in the upper layer, if the metal content is less than 25 atomic % or the sum of the content of N and the content of O is more than 65 atomic %, the quality may be reduced.

Regarding the light-shielding film of the phase shift mask blank of the first embodiment, it may be impossible to obtain a sufficient optical density from the entire light-shielding film or the film thickness may increase in the following cases: in the lower layer, the content of Cr is less than 30 atomic %, or the sum of the content of N and the content of O is more than 55 atomic %; in the interlayer, the content of Cr is less than 50 atomic %, or the content of N is more than 25 atomic %; or in the upper layer, the content of Cr is less than 30 atomic %, or the sum of the content of N and the content of O is more than 60 atomic %.

Meanwhile, etching time of the light-shielding film may increase in the following cases: in the lower layer, the content of Cr is more than 40 atomic %, or the sum of the content of N and the content of O is less than 40 atomic %; in the interlayer, the content of Cr is more than 90 atomic %, or the content of N is less than 3%; or in the upper layer, the content of Cr is more than 40 atomic %, or the sum of the content of N and the content of O is less than 50 atomic %.

Further, regarding the light-shielding film of the phase shift mask blank of the first embodiment, the content of N in the interlayer is preferably 3 to 25 atomic %, since a relatively high optical density can be obtained by a certain film thickness.

Regarding the light-shielding film of the phase shift mask blank of the first embodiment, in the lower layer, it is preferred that the metal content is 25 to 50 atomic % and the sum of the content of N and the content of O is 35 to 65 atomic %, and it is more preferred that the content of Cr is 30 to 40 atomic % and the sum of the content of N and the content of O is 40 to 55 atomic %.

Further, in the interlayer, it is preferred that metal, N and O are contained and the metal content is 50 to 90 atomic %, and it is more preferred that the sum of the content of N and the content of O is 30 atomic % or less and the content of Cr is 50 to 90 atomic %.

Further, in the upper layer, it is preferred that the metal content is 25 to 50 atomic % and the sum of the content of N and the content of O is 45 to 65 atomic %, and it is more preferred that the content of Cr is 30 to 40 atomic % and the sum of the content of N and the content of O is 50 to 60 atomic %.

1.2.2. Thickness of Each Layer

Regarding the light-shielding film of the phase shift mask blank of the first embodiment, etching time of the entire light-shielding film can be reduced since the thickness of the interlayer, which has a lower etching rate, is 30% or less of the entire thickness. If the thickness of the interlayer is more than 30% of the thickness of the entire light-shielding film, the thickness of the light-shielding film can be reduced, but the ratio of the lower layer or the upper layer, which has a higher etching rate, is reduced, and as a result, etching time cannot be reduced. Therefore, such a thickness is not preferred.

In addition, regarding the light-shielding film of the phase shift mask blank of the first embodiment, since the thickness of the interlayer is 30% or less of the thickness of the entire light-shielding film, variation of the cross-section shape due to loading caused on the upper layer is reduced during etching of the interlayer. After this process, the lower layer is rapidly etched at a first etching rate, and this suppresses further etching of a portion of the upper layer or the like which is not intended to be etched during etching of the lower layer. As a result, a good cross-section shape of the pattern is provided. Moreover, a better cross-section shape can be provided by optimizing the introduction position of the interlayer.

Regarding the light-shielding film of the phase shift mask blank of the first embodiment, the thickness of the interlayer is preferably 20% or less, and more preferably 10% or less of the thickness of the entire light-shielding film, since etching time is further reduced and a better cross-section shape can be provided. If the interlayer, which has a lower etching rate, is thick, its etched shape is more tapered, and due to this, the etching area of the lower layer is narrowed, and as a result, the total etching time is increased. However, in the case of the light-shielding film of the phase shift mask blank of the first embodiment, if the interlayer is thin, its etched shape is less tapered, and it is preferred since the development of etching of the lower layer is not prevented.

Further, if the interlayer is thinned while the thickness of the lower layer is increased, it becomes possible to form the angle of the cross-sectional shape of a pattern to be more nearly perpendicular. In other words, in the light-shielding film, by controlling the position of the interlayer, which has a low etching rate, a better cross-section shape can be obtained, and it becomes possible to improve pattern reproducibility.

Therefore, in the light-shielding film of the phase shift mask blank of the first embodiment, the thickness of the interlayer is preferably 40% or less, and more preferably 15% or less of the thickness of the lower layer.

If the value of the thickness ratio between the interlayer and the upper layer exceeds 1.0/0.7, the upper layer becomes too thin, and therefore there is a case where it becomes impossible to provide a desired antireflection function. In addition, if the value of the thickness ratio is less than 1.0/7.0, there is a case where it becomes impossible to reduce over etching time.

Therefore, in the light-shielding film of the phase shift mask blank of the first embodiment, the thickness ratio between the interlayer and the upper layer is preferably 1.0:0.7 to 1.0:7.0, and more preferably 1.0:2.0 to 1.0:7.0. When the thickness ratio is within the above-described range, it is possible to suppress further etching of a portion which is not intended to be etched, and therefore a better cross-section shape is provided and pattern reproducibility can be improved.

In the light-shielding film of the phase shift mask blank of the first embodiment, the thickness of the interlayer is preferably 0.5% or more, and more preferably 3% or more of the thickness of the entire light-shielding film. There is a difference of the etching rate between a fine pattern and a relatively large pattern (micro-loading). Therefore, when the interlayer is too thin, CD linearity by micro-loading is reduced, but it can be prevented by the above-described thickness.

1.3. Optical Density

In the present specification, the optical density (OD) satisfies the following relationship:

OD(Entire light-shielding film)=OD(Upper layer)+ OD(Interlayer)+OD(Antireflection layer)

Further, in the present specification, "optical density per unit film thickness" satisfies the following relationship:

OD per unit film thickness(nm$^{-1}$)=OD of film(layer)/ Thickness of film(layer)

In the light-shielding film of the phase shift mask blank of the first embodiment, when the optical density of the lower layer is less than 1.1, the optical density is insufficient, and therefore, the thickness of any of the layers must be increased. Meanwhile, when the optical density exceeds 1.8, the etching rate becomes lower, and therefore, it becomes difficult to reduce the film thickness.

Further, when the optical density of the interlayer is less than 0.1, the optical density of the entire light-shielding film is insufficient, and therefore, the thickness of any of the layers must be increased. In addition, since reflection by the interlayer is reduced, it becomes impossible to obtain a sufficient interferential effect. As a result, the surface reflectance is increased, and a desired reflectance cannot be obtained. Further, when the optical density of the interlayer exceeds 0.35, etching time is increased, and as a result, it becomes difficult to reduce the thickness of the resist film.

Moreover, when the optical density of the upper layer is less than 0.4, the reflectance becomes too low and the entire film thickness is increased. When the optical density exceeds 0.6, the reflectance becomes too high.

Therefore, in the light-shielding film of the phase shift mask blank of the first embodiment, the optical density of the lower layer is set at 1.1 to 1.8, the optical density of the interlayer is set at 0.1 to 0.35, and the optical density of the upper layer is set at 0.4 to 0.6. As a result, it is possible to easily obtain a light-shielding film having a desired film thickness, etching rate and optical properties.

Specifically, photomask blanks according to three embodiments having a light-shielding film with an optical density of 1.9 ((1) a light-shielding film with a low optical density; (2) a light-shielding film with a high optical density; and (3) a light-shielding film having a three-layer structure in which a layer with a high optical density is combined with a layer with a low optical density), will be compared to each other below.

(1) Light-Shielding Film Consisting of a Single Layer with Low Optical Density

When forming a single-layer light-shielding film with a high ER and OD per unit film thickness=0.036 $nm^{-1}$, the thickness of the light-shielding film is 53 nm. In this case, clear etching time becomes the shortest, but over etching time becomes longer, and there is a case where it is impossible to obtain a perpendicular form.

(2) Light-Shielding Film Consisting of a Single Layer with High Optical Density

When forming a single-layer light-shielding film with a low ER and OD per unit film thickness=0.05 $nm^{-1}$, the thickness thereof is 38 nm. In this case, clear etching time becomes the longest, and over etching time also becomes longer, and there is a case where it is impossible to obtain a perpendicular form.

(3) Light-Shielding Film Having a Three-Layer Structure in which a Layer with a High Optical Density is Combined with a Layer with a Low Optical Density When forming a light-shielding film using the following three layers: a layer with a low optical density (OD per unit film thickness=0.039 $nm^{-1}$); a layer with a high optical density (OD per unit film thickness=0.05 $nm^{-1}$); and a layer with a low optical density (OD per unit film thickness=0.036 $nm^{-1}$), it can be realized by, for example, setting thicknesses of the layers at 30 nm, 4 nm and 14 nm, respectively. In this case, its clear etching time has a length that is approximately intermediate between that of the light-shielding film of item (1) above and that of the light-shielding film of item (2) above, and over etching time is optimized.

In view of the above-described point, it is understood that etching time can be reduced by an interlayer in which a layer with a high optical density is combined with a layer with a low optical density. This can realize reduction of the thickness of the resist film, improvement of the cross-section shape and reduction of CD variation due to loading.

1.4. Etching Rate

When oxygen is included in a metal-containing layer which constitutes a light-shielding film, the etching rate is increased, but the optical density per unit film thickness is decreased, and as a result, the thickness of the interlayer is increased. Further, in the case of a film having a single speed in which there is no difference of etching rate in the longitudinal direction, variation of the cross-section shape due to loading tends to easily occur.

Further, in the case of a photomask exposed to an ArF excimer laser light, it preferably has a structure having a lower layer and an upper layer in order to prevent reduction of the pattern accuracy caused because reflected light from a transferred product such as a semiconductor substrate returns to the transferred product. However, in the case where a light-shielding film having such a laminated structure is designed with the limitation in which the thickness of the film is limited to a certain value (e.g., 60 nm or less), if the thickness of the interlayer becomes thicker, it is required to decrease the thickness of the lower layer or the upper layer, but optical properties, such as light-shielding property and reflectance, of the entire film cannot be retained only by such decrease of the thickness of the layer.

Therefore, the light-shielding film of the phase shift mask blank of the first embodiment has a second etching rate (etching rate of the interlayer), which is lower than a first etching rate (etching rate of the lower layer) and a third etching rate (etching rate of the upper layer). The etching rate can be increased by, for example, inclusion of nitrogen or oxygen in a metal film.

In the aforementioned light-shielding film, by using a metallic nitride film having a low etching rate as the interlayer, the thickness of the light-shielding film can be reduced with the optical density being kept at a high level. This enables easy design of a light-shielding film having a laminated structure and desired optical properties with the entire film thickness being limited to a certain value, and as a result, reduction of the thickness of the resist film can be realized.

In addition, since the second etching rate of the metallic nitride film is lower than the etching rates of the lower layer and the upper layer, it can change etching in the longitudinal direction. That is, during etching of the metallic nitride film having the low etching rate, variation of the cross-section shape due to loading that occurs on the upper layer having the high etching rate is reduced. After the completion of etching of the interlayer, the lower layer is rapidly etched at the first etching rate. This suppresses further etching of a portion of the upper layer or the like which is not intended to be etched during etching of the lower layer. As a result, a good cross-section shape of the pattern is provided.

In general, when a metal in the light-shielding film is nitrided, change of a crystal structure or reduction of a film density occurs. Therefore, in the case where the interlayer is a metallic nitride film, when compared to the case of a pure metallic film, the tensile stress can be more relaxed and the film stress may be more easily controlled.

2. Second Embodiment (1) The phase shift mask blank of the second embodiment is as follows:

the phase shift mask blank of the present invention, which is an original plate of a phase shift mask exposed to an ArF excimer laser light, wherein:

the phase shift mask blank has a light transmissive substrate, a phase shift film and a light-shielding film;

the phase shift film is provided between the light transmissive substrate and the light-shielding film;

the light-shielding film consists of a plurality of layers;

the optical density of the entire light-shielding film is 1.8 to 2.6;

the ratio of the optical density of a layer A constituting the plurality of layers to the sum of the optical densities of all the layers other than the layer A is 1:5 to 1:19;

each of the layers constituting the light-shielding film contains a metal; and the layers other than the layer A consist of a film comprising: the same metal as that contained in the layer A; N; and O, and the sum of the content of N and the content of O is 40 to 65 atomic %.

In the light-shielding film of the phase shift mask blank of the second embodiment, within the range of the optical density of the entire light-shielding film of 1.8 to 2.6, the ratio of the optical density of the layer A to the sum of the optical densities of all the layers other than the layer A is set at 1:5 to 1:19, thereby providing a constitution in which most of the optical density of the entire light-shielding film is provided by all the layers other than the layer A. The optical density depends on a composition and a film thickness. However, since the sum of the content of N and the content of O in the layers other than the layer A is set at 40 to 65 atomic %, though the film becomes relatively thick for obtaining a desired optical density, the etching rate is high. Due to this, the ratio of the thickness of the layer having a higher etching rate becomes higher, and therefore, etching time can be reduced and as a result, the resist film can be thinned.

In the light-shielding film of the phase shift mask blank of the second embodiment, if a value of the ratio of the optical density of the layers other than the layer A to the optical density of the layer A exceeds 1/5, the etching rate of the layers other than the layer A becomes lower. Meanwhile, if a value of the above-described ratio is less than 1/19, the thickness of the layers other than the layer A becomes too thick. Further, in the light-shielding film of the second embodiment, if the sum of the content of N and the content of O in the layers other than the layer A exceeds 65 atomic %, the film becomes thicker. Meanwhile, if the above-described sum is less than 40 atomic %, the etching rate becomes lower.

(2) In the light-shielding film of the phase shift mask blank of the second embodiment, it is preferred that the optical density per unit film thickness of the layers other than the layer A is 0.04 nm$^{-1}$ or less, and that the optical density per unit film thickness of the layer A is 0.05 nm$^{-1}$ or more.

The second embodiment includes an embodiment in which:
the light-shielding film has a laminated structure in which a lower layer, an interlayer and an upper layer are laminated in this order from the side close to a light transmissive substrate;
the optical density of the lower layer is 1.1 to 1.8;
the optical density of the interlayer is 0.1 to 0.35; and
the optical density of the upper layer is 0.4 to 0.6.

In the phase shift mask blank of this embodiment, when the optical densities of the respective layers are within the above-described ranges, it is possible to easily obtain a light-shielding film having a desired thickness, etching rate and optical properties.

In the light-shielding film of the phase shift mask blank of the second embodiment, when the optical density of the lower layer is less than 1.1, the optical density is insufficient, and therefore, the thickness of any of the layers must be increased. Meanwhile, when the optical density exceeds 1.8, the etching rate becomes lower, and therefore, it becomes difficult to reduce the film thickness.

Further, in the light-shielding film of the phase shift mask blank of the second embodiment, when the optical density of the interlayer is less than 0.1, the optical density of the entire light-shielding film is insufficient, and therefore, the thickness of any of the layers must be increased. In addition, since reflection by the interlayer is reduced, it becomes impossible to obtain a sufficient interferential effect. As a result, the surface reflectance is increased, and a desired reflectance cannot be obtained. Further, when the optical density of the interlayer exceeds 0.35, etching time is increased, and as a result, it becomes difficult to reduce the thickness of the resist film.

Moreover, in the light-shielding film of the phase shift mask blank of the second embodiment, when the optical density of the upper layer is less than 0.4, the reflectance becomes too low (particularly when the upper layer has the antireflection function) and the entire film thickness is increased. When the optical density exceeds 0.6, the reflectance becomes too high (particularly when the upper layer has the antireflection function).

(3) Regarding the light-shielding film of the phase shift mask blank of the second embodiment, it is preferred that:
the sum of the content of N and the content of O in the lower layer is 40 to 55 atomic %;
the sum of the content of N and the content of O in the interlayer is 30 atomic % or less; and that
the sum of the content of N and the content of O in the upper layer is 45 to 65 atomic %.

In the phase shift mask blank of this embodiment, when the content of N and O in each of the layers is within the predetermined range, it is possible to easily obtain a light-shielding film having a desired film thickness, etching rate and optical properties.

In the light-shielding film of the phase shift mask blank of the second embodiment, when the sum of the content of N and the content of O in the lower layer is less than 40 atomic %, the etching rate becomes lower, and when the sum of the content of N and the content of O exceeds 55 atomic %, the optical density becomes lower (the film thickness is increased), and as a result, it becomes difficult to reduce the film thickness.

Further, in the light-shielding film of the phase shift mask blank of the second embodiment, when the sum of the content of N and the content of O in the interlayer exceeds 30 atomic %, the etching rate becomes lower, and as a result, it becomes difficult to reduce the film thickness.

Moreover, in the light-shielding film of the phase shift mask blank of the second embodiment, when the sum of the content of N and the content of O in the upper layer is less than 45 atomic %, the etching rate becomes lower, and when the sum of the content of N and the content of O exceeds 65 atomic %, the optical density becomes lower (the film thickness is increased), and as a result, it becomes difficult to reduce the film thickness.

In the light-shielding film of the phase shift mask blank of the second embodiment, it is preferred that the optical density per unit film thickness of the lower layer is 0.03 to 0.04 nm$^{-1}$, and that the optical density per unit film thickness of the interlayer is 0.05 to 0.06 nm$^{-1}$.

Note that the light transmissive substrate in the phase shift mask blank of the second embodiment is the same as that of the first embodiment.

3. Third Embodiment (1) The phase shift mask blank of the third embodiment is as follows:
the phase shift mask blank of the present invention, which is an original plate of a phase shift mask exposed to an ArF excimer laser light, wherein:
the phase shift mask blank has a light transmissive substrate, a phase shift film and a light-shielding film;
the phase shift film is provided between the light transmissive substrate and the light-shielding film;
the light-shielding film has a laminated structure in which a lower layer, an interlayer and an upper layer are laminated in this order from the side close to the light transmissive substrate;
the lower layer is made of a CrOCN film, which is formed using Cr as a target in a mixed gas atmosphere comprising 45 to 65 vol % of an inert gas, 30 to 50 vol % of $CO_2$ gas and 1 to 15 vol % of $N_2$ gas;

the interlayer is made of a CrN film, which is formed using Cr as a target in a mixed gas atmosphere comprising 70 to 90 vol % of an inert gas and 5 to 25 vol % of $N_2$ gas; and the upper layer is made of a CrOCN film, which is formed using Cr as a target in a mixed gas atmosphere comprising 40 to 60 vol % of an inert gas, 25 to 45 vol % of $CO_2$ gas and 5 to 20 vol % of $N_2$ gas.

The light-shielding film of the phase shift mask blank of the third embodiment has a laminated structure in which desired optical properties are provided when the film thickness is 60 nm or less.

In the light-shielding film of the phase shift mask blank of the third embodiment, when forming an upper layer and a lower layer, $O_2$ gas or NO gas can be used. However, when a film having a high oxidation degree is desired to be formed, it is necessary to perform sputtering under a relatively high gas pressure in order to stabilize plasma. Therefore, a film obtained tends to be fragile, and such a film attached to the interior of a chamber is stripped and then attached to a substrate on which a film is being formed. As a result, the quality of an obtained product is prone to be reduced.

On the other hand, when using $CO_2$ gas, the oxidation degree can be controlled under a relatively low gas pressure. As a result, a film can be formed at a gas flow rate within a range in which a film does not become fragile.

Therefore, from the viewpoint of improvement of the quality of a product, in the light-shielding film of the phase shift mask blank of the third embodiment, as an atmosphere gas to be used for forming a layer constituting a light-shielding film, $CO_2$ gas is preferably used.

(2) Regarding the light-shielding film of the phase shift mask blank of the third embodiment, it includes an embodiment in which an inert gas for forming a lower layer consists of 10 to 30 vol % of Ar gas and 20 to 40 vol % of He gas and an inert gas for forming an upper layer consists of 10 to 30 vol % of Ar gas and 20 to 40 vol % of He gas.

Regarding the phase shift mask blank of the third embodiment, when He gas is included in an atmosphere gas, the compressive stress of an obtained layer in the case of a Cr-based light-shielding film is increased, and as a result, the film stress can be controlled. Further, He gas mainly acts only to control the film stress, and therefore it is preferred since it becomes easy to design the film stress.

Note that the light transmissive substrate in the phase shift mask blank of the third embodiment is the same as that of the first embodiment.

4. Fourth Embodiment (1) The phase shift mask blank of the fourth embodiment is as follows:

the phase shift mask blank of the present invention, which is
  an original plate of a phase shift mask exposed to an ArF excimer laser light, wherein:
  the phase shift mask blank has a light transmissive substrate, a phase shift film and a light-shielding film;
  the phase shift film is provided between the light transmissive substrate and the light-shielding film;
  the light-shielding film has a laminated structure in which a lower layer, an interlayer and an upper layer are laminated in this order from the side close to the light transmissive substrate;
  in the lower layer, the metal content is 25 to 50 atomic %, the sum of the content of N and the content of O is 35 to 65 atomic %, and the optical density is 1.1 to 1.8;
  the interlayer comprises the metal and N, wherein the metal content is 50 to 90 atomic %, the thickness is 2 to 6 nm, and the optical density is 0.1 to 0.35; and
  in the upper layer, the metal content is 25 to 50 atomic %, the sum of the content of N and the content of O is 45 to 65 atomic %, and the optical density is 0.4 to 0.6.

Regarding the light-shielding film of the phase shift mask blank of the fourth embodiment, it may be impossible to obtain a sufficient optical density from the entire light-shielding film in the following cases: in the lower layer, the metal content is less than 25 atomic %, or the sum of the content of N and the content of O is more than 65 atomic %; in the interlayer, the metal content is less than 50 atomic %; or in the upper layer, the metal content is less than 25 atomic %, or the sum of the content of N and the content of O is more than 65 atomic %. Meanwhile, etching time of the light-shielding film may increase in the following cases: in the lower layer, the metal content is more than 50 atomic %, or the sum of the content of N and the content of O is less than 35 atomic %; in the interlayer, the metal content is more than 90 atomic %; or in the upper layer, the metal content is more than 50 atomic %, or the sum of the content of N and the content of O is less than 45 atomic %.

Further, regarding the light-shielding film of the phase shift mask blank of the fourth embodiment, the content of N in the interlayer is preferably 3 to 25 atomic %, since a relatively high optical density can be obtained by a certain film thickness.

In the interlayer of the light-shielding film of the phase shift mask blank of the fourth embodiment, the content of N is preferably 3 to 25 atomic %. Moreover, in the interlayer, the optical density per unit film thickness is preferably 0.05 to 0.06 $nm^{-1}$.

(2) Regarding the light-shielding film of the phase shift mask blank of the fourth embodiment, it is preferred that:
  in the lower layer, the content of Cr is 30 to 40 atomic %, the sum of the content of N and the content of O is 40 to 55 atomic %, and the optical density is 1.1 to 1.8;
  in the interlayer, the content of Cr is 50 to 90 atomic %, the content of N is 3 to 25 atomic %, and the optical density is 0.1 to 0.35; and that
  in the upper layer, the content of Cr is 30 to 40 atomic %, the sum of the content of N and the content of O is 50 to 60 atomic %, and the optical density is 0.4 to 0.6.

Regarding the light-shielding film of the phase shift mask blank of this embodiment, it may be impossible to obtain a sufficient optical density from the entire light-shielding film in the following cases: in the lower layer, the content of Cr is less than 30 atomic %, or the sum of the content of N and the content of O is more than 55 atomic %; in the interlayer, the content of Cr is less than 50 atomic %, or the content of N is more than 25 atomic %; or in the upper layer, the content of Cr is less than 30 atomic %, or the sum of the content of N and the content of O is more than 60 atomic %. Meanwhile, etching time of the light-shielding film may increase in the following cases: in the lower layer, the content of Cr is more than 40 atomic %, or the sum of the content of N and the content of O is less than 40 atomic %; in the interlayer, the content of Cr is more than 90 atomic %, or the content of N is less than 3 atomic %; or in the upper layer, the content of Cr is more than 40 atomic %, or the sum of the content of N and the content of O is less than 50 atomic %.

Note that the light transmissive substrate in the phase shift mask blank of the fourth embodiment is the same as that of the first embodiment.

5. Preferred Embodiments Regarding the Light-Shielding Films of the First to Fourth Embodiments 5.1. Etching Rate In the phase shift mask blanks of the first, third and fourth embodiments and the phase shift mask blank of the second embodiment in which the light-shielding film has a three-layer structure, the relationship among the etching rates is preferably "Second etching rate (etching rate of the interlayer)<First etching rate (etching rate of the lower layer) ≤Third etching rate (etching rate of the upper layer)", since the angle of the cross section of a pattern becomes close to be perpendicular. Further, "First etching rate<Third etching rate" is more preferred since the angle of the cross section of the pattern further becomes close to be perpendicular.

Further, the ratio between the second etching rate and the third etching rate is preferably 1.0:1.1 to 1.0:2.0. When the third etching rate exceeds 2.0 times the second etching rate, it causes unevenness between the sections of the upper and lower layers and the section of the interlayer. In the case of less than 1.1 times, it becomes impossible to reduce the entire etching time. Further, it is preferred that the third etching rate is 0.67 nm/sec or more and that the second etching rate is 0.44 nm/sec or less.

5.2. Composition of Light-Shielding Film

In the phase shift mask blanks of the first, third and fourth embodiments and the phase shift mask blank of the second embodiment in which the light-shielding film has a three-layer structure, a metal to be contained in the lower layer, the upper layer or the interlayer is preferably a transition metal such as Cr, Mo, W and Ta. Particularly preferred is Cr because chlorine-based and oxygen-based dry etching is performed and therefore the selectivity with a glass substrate or halftone phase shift film is high. In addition, Cr is more preferred when compared to other metals because it enables not only dry etching but also wet etching.

In the phase shift mask blanks of the first, third and fourth embodiments and the phase shift mask blank of the second embodiment in which the light-shielding film has a three-layer structure, it is preferred that the lower layer or the upper layer has the Cr content of 50 atomic % or less and comprises at least one of O, C and N, and that the interlayer has the Cr content of 50 atomic % or more. By providing such a structure, a film having the relationship of "Second etching rate<First etching rate or Third etching rate" can be easily formed.

The lower layer or the upper layer preferably consists of CrN, CrON, CrO, CrC, CrCO or CrOCN, and among them, CrOCN is particularly preferred.

Further, the interlayer preferably consists of CrN, CrON, CrO, CrC, CrCO or CrOCN, and more preferably consists of CrN or CrON.

When the lower layer or the upper layer consists of CrOCN, it is preferred to employ an embodiment in which a Cr—Cr binding component and a $CrO_xN_y$ component are mixed together. Further, when the interlayer consists of CrN, it is preferred to employ an embodiment in which a Cr—Cr binding component is the main component and a $CrO_xN_y$ component is in a small amount. By providing a larger amount of the $CrO_xN_y$ component, the etching rate can be accelerated.

Moreover, the lower layer or the upper layer of this embodiment preferably has a fine amorphous structure.

Further, regarding carbon, it is preferred to provide a state in which chromium carbide (Cr—C) is the main component and other components, C—C, C—O and C—N are mixed therewith.

Further, it is preferred that the lower layer and the upper layer have the same composition but a different composition ratio and film thickness. By providing such a structure, when forming the lower layer and the upper layer, the same atmosphere gas can be used, and as a result, the process of forming the light-shielding film can be simplified. In this case, it is easy to adjust the oxidation degree of the upper layer in order to improve the quality and to adjust the optical density of the lower layer to be higher and the reflectance thereof to be lower.

5.3. Optical Density of Light-Shielding Film

In the phase shift mask blanks of the first to fourth embodiments, when the light-shielding film has an interlayer, the optical density per unit film thickness of the interlayer with respect to an ArF excimer laser light is preferably 0.05 $nm^{-1}$ or more.

5.4. Amount of Change of Flatness

In the phase shift mask blanks of the first to fourth embodiments, the amount of change of flatness before and after the film-forming process is preferably 0.05 μm or less.

5.5. Resist Film/Etching Mask Film

In the phase shift mask blanks of the first to fourth embodiments, a resist film having the thickness of 200 nm or less, and more preferably 150 nm or less can be provided on the light-shielding film.

Further, in the phase shift mask blanks of the first to fourth embodiments, an etching mask film may be provided on the light-shielding film. When the light-shielding film contains Cr, in a general dry etching process, chlorine and oxygen are used as an etching gas to cause sublimation in the form of chromyl chloride. However, since the main component of the resist is carbon, the resist is very weak against oxygen plasma. By providing an etching mask film, load on the resist film can be reduced, and therefore, it is possible to reduce the thickness of the resist film to 100 nm or less. When Cr is the main component in the light-shielding film, it is preferred to form an etching mask film having a thickness of 5 to 20 nm using SiON, SiN, $SiO_2$, MoSiON, MoSiN or the like, which has a high selectivity. Further, an organic film containing 20% or more of Si having the thickness of 20 to 40 nm can also be provided as an etching mask film.

In the phase shift mask blanks of the first to fourth embodiments, by providing an etching mask film on the light-shielding film, the thickness of a resist can be further reduced. Specifically, when the thickness of the resist is 100 nm or less, the pattern shape is significantly deteriorated, and LER (Line Edge Roughness) at the time when a mask pattern is transferred to the etching mask film is deteriorated. The present inventor found that, therefore, it is necessary to reduce the etching time of the etching mask film. Since the light-shielding film of the above-described embodiment has short etching time, the thickness of the etching mask film can be reduced, and therefore, etching time of the etching mask film can be reduced.

Further, in the phase shift mask blanks of the first to fourth embodiments, the upper layer or the lower layer in the light-shielding film preferably has an amorphous structure, since the surface roughness thereof is small and therefore the surface roughness of the upper layer, the etching mask film can be reduced. As a result, the cross-section shape and LER at the time when the etching mask film is etched are improved. Therefore, when etching the lower layer, the light-shielding film utilizing an etching mask film pattern as a mask, it is possible to prevent deterioration of the cross-section shape and LER of the light-shielding film.

5.6. Phase Shift Film

The phase shift mask blank of the present invention has a halftone phase shift film between the light transmissive substrate and the light-shielding film.

In general, the phase shift amount is set at 180°, but under exposure conditions of immersion lithography, the phase shift amount is not necessarily required to be 180°. Rather, it is preferred to reduce the thickness of the phase shift film with the phase shift amount being set at less than 180°, since the cross-section shape of an OPC pattern or circuit pattern is improved.

Specifically, the phase shift amount is preferably 160° to less than 180° at which a good pattern can be obtained by sufficiently improving resolution by phase shift effects without being dug in the substrate.

Further, the transmittance of the phase shift film is preferably 2 to 40%.

When the transmittance of the phase shift film is 2% to less than 10%, in a laminated film of the phase shift film and the light-shielding film, the thickness of the light-shielding film is set at a value required to provide a predetermined optical density (OD) (e.g., 2.8 or more, preferably 3.0 or more), and the thickness of the entire light-shielding film can be set at less than 50 nm.

Further, when the transmittance of the phase shift film is set to 10% to 40% (preferably 10% to 30%, more preferably 10% to 20%) in order to improve resolution of a transferred pattern, like the above-described case, in a laminated film of the phase shift film and the light-shielding film, the thickness of the light-shielding film is set at a value required to provide a predetermined optical density (OD) (e.g., 2.8 or more, preferably 3.0 or more), and the thickness of the entire light-shielding film can be set to 50 nm to 60 nm.

Since the thickness of the light-shielding film is set at 60 nm or less, the cross-section shape of the light-shielding film pattern is nearly a perpendicular shape, and fine pattern accuracy can be easily obtained. Therefore, also in a phase shift film pattern in which patterning is performed using this light-shielding film pattern as a mask, it becomes easy to obtain fine pattern accuracy.

Further, in the case where the optical density of the laminated film of the phase shift film and the light-shielding film is set at 3.1, when the transmittance of the phase shift film is 10%, 12%, 15% and 20%, the optical density required in the entire light-shielding film is about 2.10, 2.18, 2.28 and 2.40, respectively.

In this case, the range of the preferred optical density and the range of the preferred thickness of each of the layers in the light-shielding film are as described below.

When the transmittance of the phase shift film is 10% to 20%: in the lower layer, the optical density is 1.3 to 1.8 and the thickness is 33 nm to 46 nm; in the interlayer, the optical density is 0.1 to 0.35 and the thickness is 2 nm to 7 nm; and in the upper layer, the optical density is 0.4 to 0.6 and the thickness is 11 nm to 17 nm.

A general example in the case where the transmittance of the phase shift film is 10% or more is described in the specification of Japanese Patent No. 3445329 (Example 1 and FIG. 1), and this is a phase shift mask having a structure in which a light-shielding film pattern is formed on a phase shift film pattern formed within a pattern transfer region and a light-shielding film with a width of a predetermined value or more is formed in a non-pattern-transfer region.

Further, a general example in the case where the transmittance of the phase shift film is less than 10% (e.g., 2 to less than 10%) is described in the specification of Japanese Patent No. 3411613 (Example 1 and FIG. 1), and this is a phase shift mask having a structure in which no light-shielding film pattern is formed on a phase shift film pattern formed within a pattern transfer region and a light-shielding film with a width of a predetermined value or more is formed in a non-pattern-transfer region.

For a phase shift film, a material consisting of MoSiN or MoSiON is preferably used. By providing the above-described light-shielding film on the phase shift film consisting of the material, it becomes possible to improve LER of the phase shift film pattern compared to the case of providing a conventional Cr-based light-shielding film.

Specifically, a conventional Cr-based light-shielding film has a porous columnar structure, and since LER of the Cr-based light-shielding film pattern becomes high for this reason, even though the phase shift film has an amorphous structure, at the time of dry etching of the phase shift film, due to LER of the Cr-based light-shielding film, LER of the phase shift film pattern is deteriorated. However, in the preferred embodiment of the present invention, since the upper layer or the lower layer in the light-shielding film has an amorphous structure, it is possible to reduce LER of the light-shielding film pattern at the time of dry etching of the light-shielding film. As a result, at the time of dry etching of the phase shift film utilizing the light-shielding film pattern as a mask, LER of the phase shift film can be improved without deterioration of LER of the phase shift film pattern.

7. Phase Shift Mask and Production Method Thereof

A phase shift mask obtained from the phase shift mask blank of the present invention and a method for producing the same will be described below.

Firstly, a resist is applied to a phase shift mask blank in which a light-shielding film is formed, and it is dried to obtain a resist film. It is required to select an appropriate resist corresponding to a writing apparatus to be used. For EB writing that is usually employed, a positive-type or negative-type resist having an aromatic skeleton in a polymer is preferably used, and for production of a phase shift mask for a fine pattern in which the present invention is particularly effectively used, a chemically-amplified resist is preferably used.

The thickness of the resist film must be within a range in which a good pattern shape can be obtained and the film can function as an etching mask. In particular, when forming a fine pattern as a mask for ArF exposure, the film thickness is preferably 200 nm or less, and more preferably 150 nm or less. Note that when utilizing a two-layer resist method in which a resist comprising a silicon-based resin is combined with a lower layer comprising an aromatic resin, or a surface imaging method in which a chemically-amplified aromatic resist is combined with a silicon-based surface treatment agent, the film thickness can be further reduced. Application conditions and a drying method are suitably selected depending on the type of a resist to be used.

In order to reduce occurrence of stripping or collapsing of a fine resist pattern, a resin layer may be formed on the surface of a phase shift mask blank before application of a resist. Further, instead of forming the resin layer, a surface treatment for decreasing surface energy on the surface of the substrate (phase shift mask blank) may be performed before application of the resist. Examples of surface treatment methods include those in which HMDS or another organosilicon-based surface treatment agent that is commonly used in the semiconductor production processes is used to alkylsilylate the surface.

Next, regarding the phase shift mask blank in which the resist film is formed, writing to the resist can be carried out using a method utilizing EB irradiation or a method utilizing light irradiation. In general, the method utilizing EB irradiation is preferably used to form a fine pattern. When using a chemically-amplified resist, writing is usually carried out with energy in a range of 3 to 40 $\mu C/cm^2$, and after writing, heat treatment is applied thereto and then a resist film is subjected to development treatment to obtain a resist pattern.

Using the resist pattern obtained above as an etching mask, etching is applied to a light-shielding film or a light-shielding film and other films (phase shift film, etc.). At the time of etching, a publicly-known chlorine-based or fluorine-based dry etching can be suitably used depending on the composition of the light-shielding film (surface layer, interlayer, anti-reflection layer, etc.) or other films.

After obtaining a light-shielding pattern by etching, the resist is stripped using a predetermined stripping solution, thereby obtaining a photomask in which the light-shielding film pattern is formed.

8. Pattern Transfer

The phase shift mask of the present invention is especially useful as a mask to be used in a pattern transfer method in which a fine pattern with a DRAM half-pitch (hp) of 45 nm or less in a semiconductor design rule is formed by using an exposure method with a numerical aperture NA>1 and an exposure light wavelength of equal to or less than 200 nm.

The phase shift mask blank of the present invention is especially effective in a case where it is used for forming a resist pattern with a line width of less than 100 nm on a phase shift mask blank. A mask having an OPC structure is an example of such a phase shift mask blank. In the OPC mask, the width of an auxiliary pattern provided around the main pattern with the object of increasing the resolution of the main pattern is the smallest. Therefore, the phase shift mask blank of the present invention is especially useful for pattern transfer using a phase shift mask having these patterns.

EXAMPLES

Hereinafter, the present invention will be described in more detail based on working examples, but the present invention is not limited thereto.

Example 1

Production of Photomask Blank

In this working example, a halftone phase shift mask blank, in which a phase shift film 5 and a light-shielding film consisting of 3 layers are provided on a light transmissive substrate 10, was produced (see FIG. 1).

Firstly, on the light transmissive substrate 10 made of quartz glass having a size of 6-inch square and a thickness of 0.25 inch, a halftone phase shift film 5 for ArF excimer laser (wavelength: 193 nm) constituted by a single layer comprising Mo, Si and N as the main components was formed (thickness: 69 nm) using a single-wafer sputtering apparatus.

As shown in Table 1, sputtering (DC sputtering) conditions are as follows:
Sputtering target: a mixed target of Mo and Si (Mo:Si=8:92 mol %)
Sputtering gas: a mixed gas atmosphere of Ar gas, $N_2$ gas and He gas (Ar: 9 sccm, $N_2$: 81 sccm, He: 76 sccm)
Gas pressure during discharge: 0.3 Pa
Applied power: 2.8 kW When the ArF excimer laser light (wavelength: 193 nm) was applied, the transmittance of the obtained phase shift film 5 was 5.5% and the phase shift amount was about 180°.

Next, using the same sputtering apparatus as that by which the phase shift film 5 was formed, a lower layer 3 consisting of CrOCN was formed (thickness: 30 nm). Sputtering (DC sputtering) conditions are shown in Table 1.

After that, using the same sputtering apparatus as that by which the lower layer 3 was formed, an interlayer 2 consisting of CrN was formed (thickness: 4 nm). Sputtering (DC sputtering) conditions are shown in Table 1.

In addition, using the same sputtering apparatus as that by which the interlayer 2 was formed, an upper layer 1 consisting of CrOCN was formed (thickness: 14 nm). Sputtering (DC sputtering) conditions are shown in Table 1.

The flow rate of the sputtering gas in Table 1 is converted into volume percentage as follows:
Upper layer 1: Ar=21.0 vol %, $CO_2$=36.8 vol %, $N_2$=10.5 vol %, He=31.6 vol %
Interlayer 2: Ar=83.3 vol %, $N_2$=16.7 vol %
Lower layer 3: Ar=22.0 vol %, $CO_2$=38.9 vol %, $N_2$=5.6 vol %, He=33.3 vol %

Thus, a photomask blank, in which the phase shift film 5, the lower layer 3, the interlayer 2 and the upper layer 1 are laminated in this order on the light transmissive substrate made of quartz glass, was obtained. The optical density (OD) of the light-shielding film consisting of the lower layer 3, the interlayer 2 and the upper layer 1 with respect to light having a wavelength of 193.4 nm was 1.9. Further, the optical densities of the respective layers are as shown in Table 1.

Further, compositions and atom number densities of the upper layer 1, the interlayer 2 and the lower layer 3 of the obtained photomask blank were analyzed by RBS (Rutherford Backscattering Spectrometry). RBS is a technique for analyzing a surface composition relative to a surface density (atms/cm²) in the depth direction. When the thickness of each layer is already-known, the atom number densities (atms/cm³) can be calculated from the following formula:

Atom Number Density=Surface Density/Thickness

The atom number density of the upper layer 1 was calculated using the above-described technique.

As a result, the film composition of the upper layer 1 (thickness: 14 nm) was as follows: Cr: 34 atomic %, C: 11 atomic %, O: 39 atomic %, and N: 16 atomic %. Further, the chromium ratio in the upper layer 1 was as follows: C/Cr: 0.3, O/Cr: 1.2, and N/Cr: 0.5. Further, the atom number density of the upper layer 1 was $10.5 \times 10^{22}$ atms/cm³.

Regarding the film composition of the interlayer 2 (thickness: 4 nm), Cr was at least 64 atomic % or more, and N was at least 8 atomic % or more.

Further, the film composition of the lower layer 3 (thickness: 30 nm) was as follows: Cr: 36 atomic %, C: 15 atomic %, O: 39 atomic %, and N: 9 atomic %. Further, the chromium ratio in the lower layer 3 was as follows: C/Cr: 0.4, O/Cr: 1.1, and N/Cr: 0.3.

When the cross section of the obtained photomask blank was observed using a TEM (transmission electron microscope) and an X-ray diffractometer (XRD), the upper layer 1 had an amorphous structure in which the grain size was 1 to 2 nm. When measuring the surface roughness using an atomic force microscope (AFM), Ra=0.45 nm.

Ozone water having a concentration of 50 ppm was supplied with a flow rate of 1.4 L/minute to the surface of the substrate of the photomask blank obtained in this working example being shaken by a swing arm for 60 minutes, and changes of the thickness, surface reflectance and optical density of the light-shielding film were measured to evaluate chemical resistance.

As a result, the thickness of the light-shielding film was not changed by spraying of the ozone water. Further, change of the surface reflectance was +0.82% when using light having a wavelength of 193 nm. Change of the optical density of the light-shielding film was −0.04.

In addition, the same layer as the upper layer 1 of this working example was directly formed on a glass substrate by sputtering, and ozone water having a concentration of 50 ppm was sprayed on the upper layer 1 for 60 minutes to measure change of the reflectance. Note that in the measurement of this working example, using a spectrophotometer (Hitachi High-Technologies Corporation; U-4100), a reflection spectrum was measured before and after spraying of the ozone water, and change of the amount thereof was calculated.

As a result, changes were as follows: light having a wavelength of 193 nm: +0.7%, light having a wavelength of 257 nm: +1.5%, light having a wavelength of 365 nm: +2.0%, and light having a wavelength of 488 nm: +1.2%. As used herein, "+" represents increase of reflectance, and "−" represents decrease of reflectance.

Thus, it was confirmed that the light-shielding film of this working example has high chemical resistance with respect to ozone treatment.

(Preparation of Photomask)

On the obtained photomask blank, a chemically-amplified positive resist for electron beam writing (exposure) (PRL009: FUJIFILM Electronic Materials Co., Ltd.) was applied using a spin coat method to provide the film thickness of 150 nm. On the formed resist film, a desired pattern was wrote using an electron beam writing device, and after that, it was subjected to the development using a predetermined developer to form a resist pattern.

Next, the light-shielding film consisting of the lower layer 3, the interlayer 2 and the upper layer 1 was subjected to dry etching along the above-described resist pattern to form a light-shielding film pattern. As a dry etching gas, a mixed gas of $Cl_2$ and $O_2$ ($Cl_2:O_2$=4:1) was used.

During dry etching of the above-described light-shielding film, etching rates of the respective layers were as shown in Table 1. The clear etching time of the entire light-shielding film was 84.5 sec, and when compared to Comparative Example 1 described below, reduction in time of about 8% was confirmed. Further, when the light-shielding film pattern was subjected to cross-sectional observation using a SEM (Scanning Electron Microscopy), it was in a good state in which the angle of the cross section of the light-shielding film was perpendicular to the substrate. In addition, a perpendicular cross-section shape was obtained even when the over etching time was reduced, and it was confirmed that it is possible to provide reduction in total etching time of about 20% compared to Comparative Example 1.

Next, etching of a phase shift film was carried out using the above-described resist pattern and light-shielding film pattern as a mask to form a phase shift film pattern. Etching of the phase shift film is affected by the above-described cross-section shape of the light-shielding film pattern. Since the light-shielding film pattern had the good cross-section shape, the phase shift film pattern also had a good cross-section shape.

After that, the remaining resist pattern was stripped off, and a resist film was applied again. Then pattern exposure was carried out in order to remove an unnecessary light-shielding film pattern in the transfer area. After that, the resist film was developed to form a resist pattern. Next, wet etching was carried out to remove the unnecessary light-shielding film pattern, and the remaining resist pattern was stripped off, thereby obtaining a photomask.

The obtained photomask was subjected to resolution evaluation. The resist film had a good resolution, and the resolution of the light-shielding film pattern was less than 60 nm (corresponding to DRAM hp 32 nm).

In the phase shift mask blank produced in Example 1, when the thickness of the interlayer was regarded as 1, the thickness ratio of the upper layer was 3.5. Further, the thickness percentage of the interlayer relative to the thickness of the entire light-shielding film was 8%, and the thickness percentage of the interlayer relative to the thickness of the lower layer was 13% (see Table 2).

Reference Example 1

Figure 2:
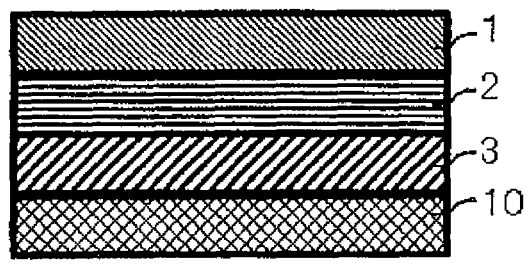
FIG. 2 shows a diagram of a binary mask blank produced in Reference Example 1.

In order to examine the light-shielding film provided in the phase shift mask of the present invention, in this reference example, a binary mask blank, in which a light-shielding film consisting of 3 layers is provided on a light transmissive substrate 10, was produced (see FIG. 2).

That is, reactive sputtering was carried out under the same conditions as those in Example 1 except that the conditions of sputtering were set as shown in Table 1.

The flow rate of the sputtering gas in Table 1 is converted into volume percentage as follows:

Upper layer 1: Ar=21.0 vol %, $CO_2$=36.8 vol %, $N_2$=10.5 vol %, He=31.6 vol %
Interlayer 2: Ar=30.8 vol %, NO=23.1 vol %, He=46.2 vol %
Lower layer 3: Ar=23.5 vol %, $CO_2$=29.4 vol %, $N_2$=11.8 vol %, He=35.3 vol %

Thus, a photomask blank as shown in FIG. 2, in which the lower layer 3, the interlayer 2 and the upper layer 1 are laminated in this order on the light transmissive substrate 10 made of quartz glass, was obtained. The optical density (OD) of the light-shielding film consisting of the lower layer 3, the interlayer 2 and the upper layer 1 with respect to light having a wavelength of 193.4 nm was 3. Further, the optical densities of the respective layers are as shown in Table 1.

Next, in the same manner as that in Example 1, the compositions of the upper layer 1, the interlayer 2 and the lower layer 3 obtained and the atom number density of the upper layer 1 were analyzed by RBS.

As a result, the film composition of the upper layer 1 (thickness: 14 nm) was as follows: Cr: 32 atomic %, C: 16 atomic %, O: 37 atomic %, and N: 16 atomic %. Further, the chromium ratio in the upper layer 1 was as follows: C/Cr: 0.5, O/Cr: 1.2, and N/Cr: 0.5. Further, the atom number density of the upper layer 1 was $11.0 \times 10^{22}$ atms/cm$^3$.

Regarding the film composition of the interlayer 2 (thickness: 25 nm), Cr was 87 atomic %, O was 9 atomic % and N was 4 atomic %. Further, the chromium ratio in the interlayer 2 was as follows: O/Cr: 0.1, and N/Cr: 0.05.

The film composition of the lower layer 3 (thickness: 25 nm) was as follows: Cr: 49 atomic %, C: 11 atomic %, O: 26 atomic %, and N: 14 atomic %. Further, the chromium ratio in the lower layer 3 was as follows: C/Cr: 0.2, O/Cr: 0.5, and N/Cr: 0.3.

When the cross section of the obtained photomask blank was observed using a TEM (transmission electron microscope) and an X-ray diffractometer (XRD), the upper layer 1 had an amorphous structure in which the grain size was 1 to 2 nm. When measuring the surface roughness using an atomic force microscope (AFM), Ra=0.28 nm.

Ozone water having a concentration of 50 ppm was supplied with a flow rate of 1.4 L/minute to the surface of the substrate of the photomask blank obtained in this reference example being shaken by a swing arm for 60 minutes, and changes of the thickness, surface reflectance and optical density of the light-shielding film were measured to evaluate chemical resistance.

As a result, the thickness of the light-shielding film was not changed by spraying of the ozone water. Further, change of the surface reflectance was −0.02% when using light having a wavelength of 193 nm. Change of the optical density of the light-shielding film was −0.06.

In addition, the same layer as the upper layer 1 of this reference example was directly formed on a glass substrate by sputtering, and ozone water having a concentration of 50 ppm was sprayed on the upper layer 1 for 60 minutes to measure change of the reflectance in the same measurement method as that in Example 1.

As a result, changes were as follows: light having a wavelength of 193 nm: +0.5%, light having a wavelength of 257 nm: +2.1%, light having a wavelength of 365 nm: +5.3%, and light having a wavelength of 488 nm: +4.6%.

Thus, it was confirmed that the light-shielding film of this reference example has high chemical resistance with respect to ozone treatment.

On the obtained photomask blank, a chemically-amplified positive resist for electron beam writing (exposure) (PRL009: FUJIFILM Electronic Materials Co., Ltd.) was applied using a spin coat method to provide the film thickness of 200 nm. On the formed resist film, a desired pattern was wrote using an electron beam writing device, and after that, it was subjected to the development using a predetermined developer to form a resist pattern.

Next, the light-shielding film consisting of the lower layer 3, the interlayer 2 and the upper layer 1 was subjected to dry etching along the above-described resist pattern to form a light-shielding film pattern. As a dry etching gas, a mixed gas of $Cl_2$ and $O_2$ ($Cl_2:O_2=4:1$) was used. After that, the remaining resist pattern was stripped off, thereby obtaining a photomask.

During dry etching of the above-described light-shielding film, etching rates of the respective layers were as shown in Table 1. Further, when observing the light-shielding film pattern in a manner similar to that in Example 1, though being tapered to a certain degree, it was in a good state in which the angle of the cross section of the light-shielding film was perpendicular to the substrate. In addition, a perpendicular cross-section shape was obtained even when the over etching time was reduced, and it was confirmed that it is possible to provide reduction in total etching time of about 25% compared to Comparative Example 2.

The obtained photomask was subjected to resolution evaluation. The resist film had a good resolution, and the resolution of the light-shielding film pattern was less than 70 nm (corresponding to DRAM hp 45 nm).

Reference Example 2

In order to examine the light-shielding film provided in the phase shift mask of the present invention like Reference Example 1, in this reference example, the same binary mask blank as that in Reference Example 1 was produced, except that the layer-forming conditions and thickness of the interlayer 2 and the thickness of the lower layer were changed from those in Reference Example 1.

That is, reactive sputtering was carried out under the same conditions as those in Example 2 except that the conditions of sputtering were set as shown in Table 1.

The flow rate of the sputtering gas in Table 1 is converted into volume percentage as follows:
Upper layer 1: Ar=21.0 vol %, $CO_2$=36.8 vol %, $N_2$=10.5 vol %, He=31.6 vol %
Interlayer 2: Ar=27.2 vol %, NO=18.2 vol %, He=54.5 vol %
Lower layer 3: Ar=23.5 vol %, $CO_2$=29.4 vol %, $N_2$=11.8 vol %, He=35.3 vol %

Thus, a photomask blank as shown in FIG. 2, in which the lower layer 3, the interlayer 2 and the upper layer 1 are laminated in this order on the light transmissive substrate 10 made of quartz glass, was obtained. The optical density (OD) of the light-shielding film consisting of the lower layer 3, the interlayer 2 and the upper layer 1 with respect to light having a wavelength of 193.4 nm was 3.1. Further, the optical densities of the respective layers are as shown in Table 1.

When the cross section of the obtained photomask blank was observed using a TEM (transmission electron microscope) and an X-ray diffractometer (XRD), the upper layer 1 had an amorphous structure in which the grain size was 1 to 2 nm. When measuring the surface roughness using an atomic force microscope (AFM), Ra=0.28 nm.

In addition, changes of the thickness, surface reflectance and optical density of the light-shielding film were measured to evaluate chemical resistance of the photomask blank in a manner similar to that in Reference Example 1.

As a result, the thickness of the light-shielding film was not changed by spraying of the ozone water. Further, change of the surface reflectance was −0.02% when using light having a wavelength of 193 nm. Change of the optical density of the light-shielding film was −0.06.

Thus, it was confirmed that the light-shielding film of this reference example has high chemical resistance with respect to ozone treatment.

After that, a photomask was obtained in a manner similar to that in Reference Example 1.

During dry etching of the above-described light-shielding film, etching rates of the respective layers were as shown in Table 1. Further, when observing the light-shielding film pattern in a manner similar to that in Example 1, it was in a good state in which the angle of the cross section of the light-shielding film was perpendicular to the substrate. In addition, a perpendicular cross-section shape was obtained even when the over etching time was reduced, and it was confirmed that it is possible to provide reduction in total etching time of about 25% compared to conventional cases.

The obtained photomask was subjected to resolution evaluation. The resist film had a good resolution, and the resolution of the light-shielding film pattern was less than 70 nm (corresponding to DRAM hp 45 nm).

TABLE 1

| | | Film Composition | Target | Sputtering gas (sccm) | | | | | | Gas Pressure (Pa) | Applied Power (kw) | Thickness (nm) | Etching rate (nm/sec) | Optical Density |
| | | | | Ar | $CH_4$ | $CO_2$ | NO | $N_2$ | He | | | | | |
| --- | --- | --- | --- | --- | --- | --- | --- | --- | --- | --- | --- | --- | --- | --- |
| Example 1 | Upper layer 1 | CrOCN | Cr | 20 | — | 35 | — | 10 | 30 | 0.2 | 1.7 | 14 | 0.67 | 0.51 |
| | Interlayer 2 | CrN | Cr | 25 | — | — | — | 5 | — | 0.1 | 1.7 | 4 | <0.44 | 0.20 |
| | Lower layer 3 | CrOCN | Cr | 20 | — | 35 | — | 5 | 30 | 0.2 | 1.5 | 30 | 0.44~0.67 | 1.17 |
| | Phase shift film 5 | MoSiN | Mo + Si | 9 | — | — | — | 81 | 76 | 0.3 | 2.8 | 69 | — | — |
| Reference Example 1 | Upper layer 1 | CrOCN | Cr | 20 | — | 35 | — | 10 | 30 | 0.2 | 1.8 | 14 | 0.67 | 0.51 |
| | Interlayer 2 | CrON | Cr | 20 | — | — | 15 | — | 30 | 0.1 | 1.7 | 25 | <0.44 | 1.33 |
| | Lower layer 3 | CrOCN | Cr | 20 | — | 25 | — | 10 | 30 | 0.2 | 1.7 | 25 | 0.44 | 1.14 |
| Reference Example 2 | Upper layer 1 | CrOCN | Cr | 20 | — | 35 | — | 10 | 30 | 0.2 | 1.8 | 14 | 0.67 | 0.51 |
| | Interlayer 2 | CrON | Cr | 15 | — | — | 10 | — | 30 | 0.1 | 1.7 | 17 | <0.44 | 0.85 |
| | Lower layer 3 | CrOCN | Cr | 20 | — | 25 | — | 10 | 30 | 0.2 | 1.7 | 39 | 0.44 | 1.71 |

Example 2

In Example 2, a phase shift mask blank was produced in a manner similar to that in Example 1, except that the transmittance of the phase shift film 5 was increased, the thickness of each of the interlayer 2 and the lower layer 3 in the light-shielding film was changed to be larger and the thickness of the entire light-shielding film was changed to be larger compared to those in Example 1.

The phase shift film 5 was formed under the following conditions:
Sputtering target: a mixed target of Mo and Si (Mo:Si=10 mol %:90 mol %)
Sputtering gas: a mixed gas atmosphere of Ar gas, $O_2$ gas, $N_2$ gas and He gas (Ar: 6 sccm, $O_2$: 15 sccm, $N_2$: 57 sccm, He: 51 sccm)
Gas pressure during discharge: 0.25 Pa
Applied power: 2.8 kW Under the above-described conditions, the halftone phase shift film 5 for an ArF excimer laser light (wavelength: 193 nm), which is constituted by a single layer comprising Mo, Si, O and N as the main components (thickness: 93 nm), was directly formed on a light transmissive substrate.

With respect to the ArF excimer laser light (wavelength: 193 nm), the transmittance of the obtained phase shift film 5 was 15% and the phase shift amount was 178°.

Next, a light-shielding film having the entire thickness of 58 nm was formed on the phase shift film under the same conditions as those in Example 1, except that in the light-shielding film, the thickness of the interlayer 2 was set at 5 nm and the thickness of the lower layer 3 was set at 39 nm. Thus, a phase shift mask blank was produced.

The structure of the phase shift mask blank produced in Example 2 and the resolution and the cross-section shape of the obtained phase shift mask were as shown in Table 2.

Note that in Table 2, values in the column of thickness ratio show, from top down, "the thickness ratio of the upper layer when the thickness of the interlayer in the light-shielding film is regarded as 1" (e.g., 2.8 in Example 2), "the thickness percentage (%) of the interlayer relative to the thickness of the entire light-shielding film" (e.g., 9% in Example 2), and "the thickness percentage (%) of the interlayer relative to the thickness of the lower layer" (e.g., 13% in Example 2).

Comparative Example 1

In this comparative example, a halftone phase shift mask blank, which has a light-shielding film consisting of a light-shielding layer and a front-surface antireflection layer, was produced.

Specifically, using an in-line sputtering apparatus, a light-shielding layer was formed on the same phase shift film as that in Example 1. Sputtering (DC sputtering) conditions are as follows:
Sputtering target: Cr
Sputtering gas: a mixed gas atmosphere of Ar gas, $N_2$ gas and He gas (Ar: 30 sccm, $N_2$: sccm, He: 40 sccm)
Gas pressure during discharge: 0.2 Pa
Applied power: 0.8 kW After that, a front-surface antireflection layer was formed on the light-shielding layer. Sputtering (DC sputtering) conditions are as follows:
Sputtering target: chromium (Cr)
Sputtering gas: a gas in which a mixed gas of argon (Ar) and methane ($CH_4$) ($CH_4$: 3.5 volume %), NO and He are mixed together (Ar+$CH_4$: 65 sccm, NO: 3 sccm, He: 40 sccm)
Gas pressure during discharge: 0.3 Pa
Applied power: 0.3 kW Thus, a photomask blank having a thickness of the light-shielding film of 48 nm, in which the phase shift film, the light-shielding layer and the front-surface antireflection layer are laminated in this order on the light transmissive substrate made of quartz glass, was obtained. The optical density (OD) of the light-shielding film consisting of the light-shielding layer and the front-surface antireflection layer with respect to light having a wavelength of 193.4 nm was 1.9.

Next, in the same manner as that in Example 1, the compositions of the front-surface antireflection layer and the light-shielding layer obtained and the atom number density of the front-surface antireflection layer were analyzed by RBS.

As a result, the film composition of the front-surface antireflection layer (thickness: 24 nm) was as follows: Cr: 34 atomic %, O: 32 atomic % and N: 23 atomic %. Further, the chromium ratio in the front-surface antireflection layer was as follows: O/Cr: 0.9, and N/Cr: 0.7. Further, the atom number density of the front-surface antireflection layer was $7.4 \times 10^{22}$ atms/cm$^3$.

The film composition of the light-shielding layer (thickness: 24 nm) was as follows: Cr: 59 atomic %, and N: 39 atomic %. Further, the chromium ratio in the light-shielding layer was as follows: N/Cr: 0.7.

Since the in-line sputtering apparatus was used, each of the light-shielding layer and the front-surface antireflection layer was a gradient film that is compositionally-graded in the thickness direction. Therefore, the above-described film compositions are averaged values.

When the cross section of the obtained photomask blank was observed using a TEM (transmission electron microscope) and an X-ray diffractometer (XRD), the front-surface antireflection layer had a low-density porous columnar structure. When measuring the surface roughness using an atomic force microscope (AFM), Ra=0.70 nm.

In addition, chemical resistance of the photomask blank obtained in this comparative example was evaluated in a manner similar to that in Example 1.

As a result, the thickness of the light-shielding film was decreased by 5.8 nm by spraying of the ozone water. Further, change of the surface reflectance was +2.72% when using light having a wavelength of 193 nm. Change of the optical density of the light-shielding film was −0.38.

In addition, the same layer as the front-surface antireflection layer of this comparative example was directly formed on a glass substrate by sputtering, and change of the amount of the reflectance was measured using the same measurement method as that in Example 1.

As a result, changes were as follows: light having a wavelength of 193 nm: +2.5% (19.8%→22.3%), light having a wavelength of 257 nm: +9.1% (16.4%→25.5%), light having a wavelength of 365 nm: +13.9% (19.9%→33.8%), and light having a wavelength of 488 nm: +11.0% (29.9%→40.9%).

Thus, it was confirmed that the light-shielding film of this comparative example had lower chemical resistance with respect to ozone treatment compared to Examples 1 and 2.

On the obtained photomask blank, a chemically-amplified positive resist for electron beam writing (exposure) was applied to provide the film thickness of 150 nm in a manner similar to that in Example 1, and a photomask was obtained in a manner similar to that in Example 1.

During dry etching of the above-described light-shielding film, the etching rate was lower than that of Example 1. The clear etching time of the entire light-shielding film was 92.0 sec. Further, when observing the light-shielding film pattern in a manner similar to that in Example 1, the angle of the cross section of the light-shielding film was not formed to be perpendicular to the substrate. For this reason, the phase shift film pattern did not have a good cross-section shape.

The obtained photomask was subjected to resolution evaluation. The resolution of the resist film was bad, and due to etching defects, the resolution of the light-shielding film pattern was 80 nm or more.

TABLE 2

| | | | Cr content (atm %) | N + O content (atm %) | Thickness (nm) | Thickness ratio (%) | OD | Resolution | Cross-section shape |
|---|---|---|---|---|---|---|---|---|---|
| Example 1 (T = 5.5%) | TOTAL | | — | — | 48 | | 1.88 | ○ | ○ |
| | TAR | CrOCN | 34 | 55 | 14 | 3.5 | 0.51 | | |
| | ABS | CrN | not less than 64 | not greater than 8 | 4 | 8 | 0.20 | | |
| | BAR | CrOCN | 36 | 48 | 30 | 13 | 1.17 | | |
| Example 2 (T = 15%) | TOTAL | | — | — | 58 | | 2.28 | ○ | ○ |
| | TAR | CrOCN | 34 | 55 | 14 | 2.8 | 0.51 | | |
| | ABS | CrN | not less than 64 | not greater than 8 | 5 | 9 | 0.25 | | |
| | BAR | CrOCN | 36 | 48 | 39 | 13 | 1.52 | | |

Example 3

In Example 3, a light-shielding film having the same composition as that in Reference Example 2 was formed on a phase shift film having the transmittance of 20%, wherein the thicknesses of the upper layer, the interlayer and the lower layer were changed as shown in Table 3, thereby producing a phase shift mask blank.

The phase shift film 5 was formed under the following conditions:

Sputtering target: a mixed target of Mo and Si (Mo:Si=4 mol %:96 mol %)

Sputtering gas: a mixed gas atmosphere of Ar gas, $O_2$ gas, $N_2$ gas and He gas (Ar: 11.5 sccm, $O_2$: 8.1 sccm, $N_2$: 50 sccm, He: 100 sccm)

Under the above-described conditions, the phase shift film 5, which is constituted by a single layer comprising Mo, Si, O and N as the main components (thickness: 74 nm), was formed on a light transmissive substrate.

With respect to an ArF excimer laser light (wavelength: 193 nm), the transmittance of the obtained phase shift film 5 was 20.0% and the phase shift amount was 177.4°.

When the obtained phase shift film was analyzed by RBS, Mo was 1.8 atomic %, Si was 37.2%, N was 48.1% and O was 12.7 atomic %.

Next, a light-shielding film was formed on the phase shift film under the same sputtering conditions as those in Reference Example 2, wherein the thicknesses of the lower layer, the interlayer and the upper layer were set at 36 nm, 5 nm and 14 nm, respectively.

The structure of the phase shift mask blank produced in Example 3 and the resolution and the cross-section shape of the obtained phase shift mask were as shown in Table 3. Further, the etching rates of the respective layers in the light-shielding film were the same as those in Reference Example 2.

Example 4

In Example 4, a light-shielding film having the same composition as that in Reference Example 2 was formed on a phase shift film having the transmittance of 14.8%, wherein the thicknesses of the upper layer, the interlayer and the lower layer were changed as shown in Table 3, thereby producing a phase shift mask blank.

The phase shift film 5 was formed under the following conditions:

Sputtering target: a mixed target of Mo and Si (Mo:Si=4 mol %:96 mol %)

Sputtering gas: a mixed gas atmosphere of Ar gas, $O_2$ gas, $N_2$ gas and He gas (Ar: 11 sccm, $O_2$: 4.2 sccm, $N_2$: 50 sccm, He: 100 sccm)

Under the above-described conditions, the phase shift film 5, which is constituted by a single layer comprising Mo, Si, O and N as the main components (thickness: 68 nm), was formed on a light transmissive substrate.

With respect to an ArF excimer laser light (wavelength: 193 nm), the transmittance of the obtained phase shift film 5 was 14.8% and the phase shift amount was 176.8°.

When the obtained phase shift film was analyzed by RBS, Mo was 1.8 atomic %, Si was 38.0%, N was 52.5% and O was 7.5 atomic %.

Next, a light-shielding film was formed on the phase shift film under the same sputtering conditions as those in Reference Example 2, wherein the thicknesses of the lower layer, the interlayer and the upper layer were set at 33 nm, 5 nm and 14 nm, respectively.

The structure of the phase shift mask blank produced in Example 4 and the resolution and the cross-section shape of the obtained phase shift mask were as shown in Table 3. Further, the etching rates of the respective layers in the light-shielding film were the same as those in Reference Example 2.

Example 5

In Example 5, a light-shielding film having the same composition as that in Reference Example 2 was formed on a phase shift film having the transmittance of 13.4%, wherein the thicknesses of the upper layer, the interlayer and the lower layer were changed as shown in Table 3, thereby producing a phase shift mask blank.

The phase shift film 5 was formed under the following conditions:

Sputtering target: a mixed target of Mo and Si (Mo:Si=4 mol %:96 mol %)

Sputtering gas: a mixed gas atmosphere of Ar gas, $O_2$ gas, $N_2$ gas and He gas (Ar: 10.5 sccm, $N_2$: 55 sccm, He: 100 sccm)

Under the above-described conditions, the phase shift film 5, which is constituted by a single layer comprising Mo, Si and N as the main components (thickness: 58 nm), was formed on a light transmissive substrate.

With respect to an ArF excimer laser light (wavelength: 193 nm), the transmittance of the obtained phase shift film 5 was 13.4% and the phase shift amount was 160.0°.

When the obtained phase shift film was analyzed by RBS, Mo was 1.8 atomic %, Si was 39.7% and N was 58.3%.

Next, a light-shielding film was formed on the phase shift film under the same sputtering conditions as those in Reference Example 2, wherein the thicknesses of the lower layer, the interlayer and the upper layer were set at 32 nm, 4 nm and 14 nm, respectively.

The structure of the phase shift mask blank produced in Example 5 and the resolution and the cross-section shape of the obtained phase shift mask were as shown in Table 3. Further, the etching rates were the same as those in Reference Example 2.

TABLE 3

| | | Cr content (atm %) | N + O content (atm %) | Thickness (nm) | Thickness ratio (%) | OD | Resolution | Cross-section shape |
|---|---|---|---|---|---|---|---|---|
| Example 3 (T = 20.0%) | TOTAL | — | — | 55 | | 2.36 | ○ | ○ |
| | TAR CrOCN | 32 | 53 | 14 | 2.8 | 0.51 | | |
| | ABS CrON | 87 | 13 | 5 | 9 | 0.27 | | |
| | BAR CrOCN | 49 | 40 | 36 | 14 | 1.58 | | |
| Example 4 (T = 14.8%) | TOTAL | — | — | 52 | | 2.23 | ○ | ○ |
| | TAR CrOCN | 32 | 53 | 14 | 2.8 | 0.51 | | |
| | ABS CrON | 87 | 13 | 5 | 10 | 0.27 | | |
| | BAR CrOCN | 49 | 40 | 33 | 15 | 1.45 | | |
| Example 5 (T = 13.4%) | TOTAL | — | — | 50 | | 2.13 | ○ | ○ |
| | TAR CrOCN | 32 | 53 | 14 | 3.5 | 0.51 | | |
| | ABS CrON | 87 | 13 | 4 | 8 | 0.21 | | |
| | BAR CrOCN | 49 | 40 | 32 | 13 | 1.41 | | |

In Examples 2-5, the resist film had a good resolution, and the resolution of the light-shielding film pattern was less than 60 nm. In addition, the cross-section shape was perpendicular and good.

INDUSTRIAL APPLICABILITY

The photomask blank of the preferred embodiment of the present invention can suppress shadowing, and therefore can be used for high-NA lithography and can also be used for lithography using an exposure light having a short wavelength. Therefore, by using the photomask blank of the preferred embodiment of the present invention, a very fine mask pattern can be formed.

In addition, the photomask blank of the preferred embodiment of the present invention can be applied to, for example, a photomask blank of a generation of hp 45 nm, hp 32 nm or beyond in hyper-NA-ArF lithography.

The invention claimed is:

1. A phase shift mask blank, which is an original plate of a phase shift mask exposed to an ArF excimer laser light, wherein:
the phase shift mask blank has a light transmissive substrate, a phase shift film and a light-shielding film;
the phase shift film is provided between the light transmissive substrate and the light-shielding film;
the phase shift amount of the phase shift film with respect to the ArF excimer laser light is 160° to 180°
the transmittance of the phase shift film is 2 to 40%;
the light-shielding film consist of a plurality of layers;
the optical density of the entire light-shielding film is 1.8 to 2.6;
the ratio of the optical density of a layer A constituting the plurality of layers to the sum of the optical densities of all the layers other than the layer A is 1:5 to 1:19;
each of the layers constituting the light-shielding film contains a metal; and
the layers other than the layer A consist of a film comprising: the same metal as that contained in the layer A; N; and O, and the sum of the content of N and the content of O is 40 to 65 atomic %.

2. The phase shift mask blank according to claim 1, wherein:
the optical density per unit film thickness of the layers other than the layer A is 0.04 $nm^{-1}$ or less, and that the optical density per unit film thickness of the layer A is 0.05 $nm^{-1}$ or more.

3. The phase shift mask blank according to claim 1, wherein: the light-shielding film has a laminated structure in which a lower layer, an interlayer and an upper layer are laminated in this order from the side close to a light transmissive substrate.

4. The phase shift mask blank according to claim 3, wherein: the optical density per unit film thickness of the upper layer or the lower layer is 0.04 $nm^{-1}$ or less; and the optical density per unit film thickness of the interlayer is 0.05 $nm^{-1}$ or more.

5. The phase shift mask blank according to claim 3, wherein:
the optical density of the lower layer is 1.1 to 1.8;
the optical density of the interlayer is 0.1 to 0.35; and
the optical density of the upper layer is 0.4 to 0.6.

6. The phase shift mask blank according to claim 3, wherein:
the sum of the content of N and the content of O in the lower layer is 40 to 55 atomic %;
the sum of the content of N and the content of O in the interlayer is 30 atomic % or less; and
the sum of the content of N and the content of O in the upper layer is 45 to 65 atomic %.

7. The phase shift mask blank according to claim 3, wherein: the optical density per unit film thickness of the lower layer is 0.03 to 0.04 $nm^{-1}$; and the optical density per unit film thickness of the interlayer is 0.05 to 0.06 $nm^{-1}$.

8. The phase shift mask blank according to claim 3, wherein:
in the lower layer, the metal content is 25 to 50 atomic %, the sum of the content of N and the content of O is 35 to 65 atomic %, and the optical density is 1.1 to 1.8;
the interlayer comprises the metal and N, wherein the metal content is 50 to 90atomic %, the thickness is 2 to 7 nm, and the optical density is 0.1 to 0.35; and in the upper layer, the metal content is 25 to 50 atomic %, the sum of the content of N and the content of O is 45 to 65 atomic %, and the optical density is 0.4 to 0.6.

9. The phase shift mask blank according to claim 3, wherein:
in the lower layer, the content of Cr is 30 to 40 atomic %, the sum of the content of N and the content of O is 40 to 55 atomic %, and the optical density is 1.1 to 1.8;
in the interlayer, the content of Cr is 50 to 90 atomic %, the content of N is 3 to 25 atomic %, and the optical density is 0.1 to 0.35; and
in the upper layer, the content of Cr is 30 to 40 atomic %, the sum of the content of N and the content of O is 50 to 60 atomic %, and the optical density is 0.4 to 0.6.

10. The phase shift mask blank according to claim 3, wherein the thickness of the interlayer is 30% or less of the thickness of the entire light-shielding film.

11. The phase shift mask blank according to claim 3, wherein the thickness of the interlayer is 40% or less of the thickness of the lower layer.

12. The phase shift mask blank according to claim 3, wherein the thickness ratio of the interlayer to the upper layer is 1.0:0.7 to 1.0:7.0.

13. The phase shift mask blank according to claim 1, wherein:
the phase shift amount of the phase shift film is less than 180° and the transmittance of the phase shift film is 10% or more; and
the thickness of the entire light-shielding film is 50 nm to 60 nm.

14. The phase shift mask blank according to claim 1, wherein the phase shift film is made of a material comprising: at least one substance selected from the group consisting of oxygen and nitrogen; a metal; and silicon as the main components.

15. A phase shift mask, which is produced using the phase shift mask blank according to claim 1.

* * * * *